United States Patent [19]

Elsenbaumer et al.

[11] Patent Number: 4,640,006

[45] Date of Patent: Feb. 3, 1987

[54] METHOD OF FORMING BATTERY ELECTRODE BY IRREVERSIBLE DONOR DOPING OF CONJUGATED BACKBONE POLYMERS

[75] Inventors: Ronald L. Elsenbaumer; Granville G. Miller, both of Morristown; James E. Toth, Maplewood, all of N.J.

[73] Assignee: Allied Corporation, Morris Township, Morris County, N.J.

[21] Appl. No.: 745,099

[22] Filed: Jun. 17, 1985

Related U.S. Application Data

[62] Division of Ser. No. 556,718, Nov. 30, 1983, Pat. No. 4,526,708.

[51] Int. Cl.[4] .................. H01M 10/38; H01B 1/06
[52] U.S. Cl. ............................. 29/623.1; 429/213; 429/194; 429/218; 252/518; 524/174; 526/285; 528/488
[58] Field of Search ............... 429/213, 194, 218; 29/623.1; 252/500, 518; 524/174; 526/285; 528/488, 491

[56] References Cited

U.S. PATENT DOCUMENTS 4,204,216  5/1980  Heeger et al. .................. 357/8
4,321,114  3/1982  MacDiarmid et al. .......... 204/2.1

OTHER PUBLICATIONS

M. B. Dines, Mat. Res. Bull., vol. 10, pp. 287-292, (1975), "Lithium Intercalation via N-Butyllithium of the Layered Transition Metal Dichalcogenides".

A. A. Morton et al., Journal of Organic Chemistry, vol. 23, p. 1626, "Metalation of Cumene" (1958).

M. S. Whittingham et al., J. Electro-Chem. Sci. and Technical, vol. 24, pp. 1387-1388 (1979).

J. of Polymer Science, Polymer Chemical edition, vol. 12, p. 11 (1974).

Synthetic Metals, vol. 1 (1979/1980), pp. 101-118, A. G. MacDiarmid et al., "Organic Metals and Semiconductors: Chemistry of Polyacetylene, (CH)x, and Its Derivatives".

Journal De Physique, Colloque C3, Tome 44, 06-1983, "Chemical N Doping of Polyacetylene", B. Francois et al., pp. C321-C328.

Primary Examiner—Anthony Skapars
Attorney, Agent, or Firm—Richard C. Stewart; Gerhard H. Fuchs

[57] ABSTRACT

Conjugated backbone polymers (e.g., polyacetylene), especially formed into a battery electrode, are contacted with a compound MR where M is an alkali metal and R is alkyl of 1-12 carbons, phenyl or alkylphenyl of 7-12 carbons. The method is particularly suited to treatment of battery electrodes to avoid a high initial internal resistance.

12 Claims, No Drawings

METHOD OF FORMING BATTERY ELECTRODE BY IRREVERSIBLE DONOR DOPING OF CONJUGATED BACKBONE POLYMERS

This application is a division of application Ser. No. 556,718, filed Nov. 30, 1983, now U.S. Pat. No. 4,526,708.

BACKGROUND OF THE INVENTION

The present invention relates to the donor doping of conjugated backbone polymers such as polyacetylene.

Conjugated backbone polymers, such as polyacetylene, are known which can be intercalated by alkali metal cations chemically or electrochemically. In chemical doping, the polymer is reacted with an electroactive organometallic compound of an alkali metal such as an alkali metal naphthalide (e.g. lithium naphthalide or sodium naphthalide). Examples of such processes are contained in A. G. MacDiarmid et. al. and A. J. Heeger Syn. Metals, Vol. 1, pp. 101-118 (1980). Donor doped polyacetylene is especially described in U.S. Pat. No. 4,204,216 to Heeger et al. (1980).

In electrochemical doping, the polymer (e.g. polyacetylene) is contacted with a salt solution (e.g. lithium perchlorate in propylene carbonate) and electrons are fed into the polymer and withdrawn from the counter electrode, causing the polymer to become negatively charged and the cation of the salt (e.g. lithium cations) to migrate into the polymer as a counterion. Such electrochemical doping can be used as a charging mechanism for a battery (see, e.g., U.S. Pat. No. 4,321,114 to MacDiarmid et al. (1982)). Such batteries are difficult to break in, however, if neutral polymer is initially used for the anode since the undoped polymer has a high internal resistance which hampers the initial introduction of electrons. Ways to render the electrode less resistive in the undoped state are by either filling the polymer with a conductive substance (e.g., graphite powder) or by initially chemically doping the polymer. Both methods introduce extraneous substances (e.g. naphthalene or graphite) into the battery, however, which add weight and, in some cases, complicating side reactions (such as self-discharge of the battery moderated by naphthalene) without increasing the active mass of the electrode.

BRIEF DESCRIPTION OF THE INVENTION

It has been discovered that conjugated backbone polymers can be chemically doped irreversibly by contact with organometallic compounds of an alkali metal covalently bonded to organic moieties that are not electroactive: alkyls of 1-12 carbons, phenyl and alkyl phenyls of 7-12 carbons. Accordingly, the present invention includes a method of introducing electrons along with alkali metal cations into a conjugated backbone polymer which comprises contacting said conjugated backbone polymer with a compound of the formula MR wherein M is an alkali metal and R is selected from the group consisting of alkyls of 1-12 carbons, phenyl and alkylphenyls of 7-12 carbons, under conditions which form negatively charged conjugated backbone polymer intercalated by $M^+$ cations and an organic by-product not susceptible to reaction with the negatively charged conjugated polymer to reform the compound MR.

DETAILED DESCRIPTION OF THE INVENTION

The present invention is applicable to doping various conjugated backbone polymers, especially when formed into battery electrodes, but also in other forms and for other applications. The polymer may be polyacetylene, polyphenylene vinylene, polyquinoline, polythiophene or substituted forms thereof, with polyacetylene being preferred. The polyacetylene is preferably in the microfibular form produced by the Shirakawa et al. process (J. Polymer Sci., Polym. Chem. Ed., vol. 12, p. 11 (1974)) and may be, at the time of doping, either predominately in the cis form or predominately in the trans form. The trans forms dope to higher levels giving rise to lower open circuit voltages in battery configurations.

The compound used for doping can be indicated by the formula MR. "M" is an alkali metal such as lithium, sodium, potassium or cesium, and is preferably lithium, sodium or potassium. "R" may be alkyl, phenyl or alkyl-phenyl, such as methyl, ethyl, allyl, isopropyl, butyl, t-butyl, sec-butyl, amyl, hexyl, decyl, dodecyl, phenyl, p-methylphenyl, p-isopropylphenyl, 2,4-dimethylphenyl, 2,4-diisopropylphenyl, cumyl, p-hexylphenyl or benzyl or $(CH_3)_3SiCH_2—$. Preferred compounds are those lithium, sodium and potassium compounds wherein "R" is alkyl of 2-4 carbons or phenyl, with the lithium and sodium compounds being, in general, more preferred. The nature of the R group determines final doping level at a given temperature (other conditions being constant). Thus, the degree of doping and the magnitude of the initial conductivity can be controlled by proper choice of R.

The contacting can be conducted at any convenient temperature and pressure, together with other contacting conditions such as contact time and solvent, which facilitates production of the negatively charged conjugated backbone polymer intercalated by alkali metal cations. Also, higher temperatures may lead to higher doping levels. Unlike the doping with the corresponding naphthalides, the back reaction, reforming the organometallic compound, will generally not occur in the present process and no special conditions are required to avoid back reaction. The organic by-product will generally either be a saturated hydrocarbon R—R, or may be a mixture of saturated and unsaturated hydrocarbons (e.g., 1-butene and octane formed from butylsodium) or other condensation products of the R group such as by condensations of two-phenyl rings into biphenyl. The concentration of organometallic compound is not critical, with sufficient amounts generally being employed to dope the polymer to a conductivity of at least $10^{-5}$ S/cm.

The invention is particularly applicable to the doping of conjugated backbone polymers formed into battery electrodes, such as polyacetylene battery electrodes. In such an embodiment, a battery enclosure contains at least two electrodes, at least one of which comprises the conjugated backbone polymer. The compound MR is introduced into the battery enclosure and contacts the conjugated backbone polymer under conditions forming the negatively charged conjugated backbone polymer intercalated by $M^+$ cations and an organic by-product not susceptible to reaction with the negatively charged polymer to reform the compound MR, nor with the counterelectrode material such as to impair function of the battery. In the event that both electrodes are a conjugated backbone polymer, the process will generally donor dope both electrodes. In the event that one electrode is an alkali metal (e.g. lithium) or alloy (e.g. lithium-aluminum alloy) only the conjugated backbone polymer electrode will be affected by the process. In the event that one electrode is conjugated backbone polymer and the other electrode is a transition metal chalcogenide (such as titanium disulfide), both the conjugated backbone polymer and the transition metal chalcogenide will be doped by alkali metals. It is known from an article by M. S. Whittingham, Prog. Solid St. Chem., vol. 12, pages 41–49 (1978) (especially pages 45–46) that n-butyl lithium can form lithium derivatives of alkali metal chalcogenides. Other references along these lines indicate that butyllithium will not dope graphite, M. S. Whittingham et. al., J. Electrochem. Sci. and Technol., Vol. 124, 1387–88 (1977); M. B. Dines, Mat. Res. Bull., vol. 10, pp 287–92 (1975). Accordingly, it is not surprising that such a process will dope or intercalate alkali metal into the transition metal chalcogenide in such a polymer/transition metal chalcogenide battery. It is possible, however, that with certain transition metal chalcogenides, only lithium, and not sodium, potassium or cesium will intercalate in such a doping process; and therefore if sodium or potassium organometallic compounds are used, only the conjugated backbone polymer may be doped by the present process. In all forms of the invention, and especially when the conjugated backbone polymer is a battery electrode, the process may be conducted by selecting organometallic compounds with R forming by-products which are gaseous, and/or selecting operating conditions in which the by-product is gaseous, such that the by-product can be removed from the battery electrode as a gas without affecting the donor doped electrode or the solvent or other components of the battery. It is for this reason that the organometallic compounds wherein R is alkyl of 2–4 carbons are especially preferred.

Once the battery electrodes are partially doped by the process of the present invention, they are susceptible to rapid charging electrochemically in the conventional manner, thus eliminating the normal break in cycle (or lengthy manufacturing time and/or break-in time) necessary when undoped polymer is used.

When one electrode of the battery is an alkali metal such as lithium, sodium, potassium or cesium and the other is the conjugated polymer, the agent RM can be formed in situ by incorporating the corresponding RX compound wherein X is Cl, Br, I, SCN, SR' where R' can be any component described as R. Thus, RX is converted to RM according to the following equation:

$$R-X + 2M \rightarrow RM + MX$$

wherein the formed RM acts as the irreversible chemical doping agent for the polymer. For example, incorporating butyl bromide into a lithium/polyacetylene battery would result in the formation of butyl lithium and lithium bromide upon reaction of butyl bromide with the lithium anode. The resulting butyl lithium would then dope the polyacetylene such as to impart to it an initial conductivity of from $10^{-5}$ to about 10 s/cm depending on the concentration of butyl bromide initially used. This modification eliminates the need to handle the very reactive alkali metal compounds during the battery fabrication step.

As described above, the doping level can be controlled by the identity of R and, possibly, the identity of M and the doping temperature. Open circuit voltages as low as 0.6 V versus a lithium counter electrode (corresponding to a doping level above 10%) are obtainable with the present process as applied to polyacetylene.

EXAMPLES

Example 1

Doping with n-Butyl Lithium

Into a dried, two legged reaction vessel was placed a piece of polyacetylene film (prepared via the Shirakawa technique) 5 cm×5 cm×0.02 cm and an excess of n-Butyl lithium as a solution in hexane (10 ml of 1.6M soln, Aldrich) under argon. The film was allowed to sit in the n-Butyl lithium solution at room temperature for 64 hr. The reaction vessel was evacuated to $10^{-3}$ torr and the solution was poured off the film into the other leg of the reaction vessel. The film was repeatedly washed by distilling the hexane from the spent n-Butyl lithium solution onto the doped film followed by decantation back into the leg containing the spent solution. The film was then dried under vacuum ($10^{-6}$ tor) and transferred to an argon-filled dry box. The conductivity of the golden film was found to be 3 S/cm. Elemental analysis gave: 90.00% C, 7.50% H, 1.96% Li corresponding to an average composition of $(C_{1.0}H_{1.0}Li_{0.037})_x$. The open circuit voltage of this film relative to a Li metal electrode was found to be 1.2V (1.5M LiClO$_4$ in THF).

Example 2

A repeat of example one using a hexane/THF (1:1) mixture as the reaction solvent with a contact time of 36 hr. give a doped film with a conductivity of 15 S/cm. Elemental analysis gave an average composition corresponding to $(C_{1.0}H_{1.0}Li_{0.07})_x$.

Example 3

Doping with Phenyl Lithium

The procedure described in Example 1 was repeated using Phenyl lithium (2M in cyclohexane/ether (7/3); Ventron) in place of n-Butyl lithium. After work-up, the film exhibited a conductivity of 130 S/cm. Elemental analysis gave a composition corresponding to $(C_{1.0}H_{1.0}Li_{0.10})_x$. The open circuit voltage of the doped film relative to Li metal reference electrode was 1.09 volts (1.5 LiClO$_4$ in THF).

Example 4

Doping with tert-Butyl Lithium

The procedure of Example 1 was repeated using t-Butyl lithium in place of n-Butyl lithium (1.7M in pentane, Aldrich) with a contact time of 44 hr. at room temperature. After work-up, the film exhibited a conductivity of 10 S/cm. Analysis gave an average composition corresponding to $(CHLi_{0.057})_n$.

Example 5

Doping with Methyl Lithium

The procedure of Example 1 was repeated using methyl lithium (1.25M in diethyl ether, Aldrich) in place of n-Butyl lithium. Contact time was 44 hr. After work-up the film exhibited a conductivity of 4×10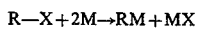$^{31}$ 3 S/cm. Analysis gave an average composition corresponding to $(CHLi_{0.037})_x$.

Example 6

Doping with Sec-butyl Lithium

The procedure of example 1 was repeated using sec-butyl lithium (1.4M in cyclohexane) in place of n-butyl lithium. Contact time was 44 hr. After work-up the film exhibited a conductivity of 44 S/cm, and an open circuit voltage vs Li of 1.03 V (1M LiBBu$_4$ in 2-methyl-THF).

Example 7

Doping with Triphenylsilyl Lithium

(A case which does not work)

The procedure of example 1 was repeated using triphenyl silyl lithium (1M in THF, Ventron) in place of n-butyl-lithium. Contact time was 44 hr. at room temperature. After work-up the film exhibited a conductivity nearly the same as that of undoped polyacetylene. Thus, this reagent does not dope polyacetylene to any appreciable extent.

Example 8

To Show That Poly p-phenylene is not Doped by n-butyl Lithium

The procedure of example 1 was repeated using poly (p-phenylene) powder in place of the polyacetylene film. After work-up, the powder was compacted into a pellet in an argon-filled dry box utilizing a (KBr infrared) die. The conductivity of the treated polymer pellet was $<10^{-7}$ S/cm.

Example 9

To Show that Grignard Reagents (RM, where M=MgX, X=halogen) do not substantially dope polyacetylene: Doping with n-Butylmagnesium Chloride The procedure of example 1 was repeated using n-butylmagnesium chloride (2.0M in diethylether, Aldrich) in place of n-Butyl lithium. After work-up, the resulting film displayed a conductivity of $10^{-4}$ S/cm which was mostly ionic.

Example 10

Doping Trans-Polyacetylene with Phenyl Lithium

A piece of polyacetylene film as in example 1 was thermally isomerized by heating under vacuum at 180° C. for 5 min. The isomerized film was then treated as in example 3, contact time was 48 hr. After work-up the film exhibited a conductivity of 158 S/cm and open circuit voltage of 0.65 volts (vs lithium metal in 1M LiBBu$_4$ in 2-methyl-THF). Thus, doping the trans-form results in higher conductivity and lower open-circuit voltages.

Example 11

Doping Trans-Polyacetylene with n-Butyl Lithium

A piece of cis polyacetylene was isomerized as in example 10 and treated with n-butyl lithium as in example 1. Contact time was 48 hr. After work-up the film exhibited a conductivity of 0.5 S/cm and an open circuit voltage of 1.06 volts (vs lithium in 1M LiBBu$_4$ in 2-methyl-THF).

Example 12

Polyacetylene doped with phenylpotassium

Phenylpotassium was prepared by stirring 0.5 g of distilled anisole with 0.33 g of potassium metal in 25 ml of n-heptane for 16 hr. at room temperature (similar to procedure of A. A. Morton and E. J. Lanpher, *J. Org. Chem.*, 23, 1636 (1958)). Several pieces of polyacetylene, each $1\times2\times0.02$ cm were added to the fine gray suspension of phenylpotassium under an argon atmosphere. After 48 hr. 10 ml of dry THF were added and the mixture was filtered. The polyacetylene sheets were washed with tetrahydrofuran (THF) and vacuum dried. The polyacetylene sheets ranged in conductivity from 12 to 17 S/cm.

Example 13

A Polyacetylene/Li Battery Employing Methyl Lithium as Additive

A polyacetylene cathode/lithium anode battery was constructed utilizing 1M LiBB$\mu_4$ in 2-methyl-THF as the electrolyte which contained a small amount of methyl lithium (ca 0.1M). The open-circuit voltage of the as-assembled cell was 1.3 volts vs lithium. The initial resistance of the cell was 40 ohms and the initial discharge of the battery was rapid. A similar cell not employing the methyl lithium as an additive displayed an open circuit voltage of 2.4V (vs Li) and a high internal resistance of 1000 ohm. Initial discharge rates were much slower.

Example 14

Lithium/Polyacetylene Battery using n-Butyl lithium as Additive

Another battery was fabricated in a sealed glass container using polyacetylene as the cathode and lithium metal as the anode with 1M LiBBu$_4$ in 2-methyl-THF as the electrolyte. Upon the addition of a small amount (50 $\mu$l) of n-Butyl lithium (1.6M in cyclohexane) to the assembled battery, the open circuit voltage dropped from 2.4 volts to 1.09 volts, and the internal resistance of the battery dropped from 1000 ohm to 10.4 ohm. The initial discharge of the battery proceeded rapidly and required no 37 break-in" period. After recharging at an applied voltage of 2.2 V, the open-circuit voltage remained stable at 1.6 volts. Cycling of the battery between 2.2 and 0.2 volts gave excellent conlombic efficiencies: 91% on the first cycle and greater than 97% on subsequent cycles for doping levels of greater than 10%, i.e. $[CH)^{-y}Li_y^+]_x$ with y being greater than 0.10.

We claim:

1. A method of fabricating a battery comprising the step of introducing a compound of the formula MR into a battery enclosure containing at least two electrodes, at least one of which comprises polyacetylene and also containing an organic solvent, under conditions forming negatively charged polyacetylene intercalated by M$^+$ cations in an amount sufficient to produce a conductivity in said polyacetylene of at least $10^{-5}$ S/CM and an organic by-product not susceptible to reaction with negatively charged polyacetelene to reform the compound MR; M being an alkali metal and R being selected from the group consisting of alkyls 1–12 carbons, phenyl and alkylphenyls of 7–12 carbons.

2. The method of claim 1 wherein M is Li.

3. The method of claim 1 wherein M is Na.

4. The method of claim 1 wherein M is K.

5. The method of claim 1 wherein R is alkyl of 2–4 carbons.

6. The method of claim 1 wherein said organic by-product is the alkane R–R having 4–8 carbons.

7. The method of claim 1 wherein the anode and cathode of said battery each comprise polyacetylene and both become intercalated by $M^+$.

8. The method of claim 7 wherein at least one of said anode and cathode are further intercalated by $M^+$ cations by electrochemical reaction with alkali metal electrode in contact with the organic solvent, said solvent having an alkali metal salt dissolved therein during said electrochemical reaction.

9. The method of claim 1 wherein one electrode is a transition metal chalcogenide and the other electrode is polyacetylene.

10. The method of claim 9 wherein one electrode is titanium disulfide and the other electrode is polyacetylene.

11. The method of claim 10 wherein M is Li.

12. The method of claim 1 wherein the compound MR is introduced into the battery enclosure by introducing the compound RX and the alkali metal M under conditions where the compound MR and the by-product MX are formed in situ, X being halogen or pseudohalogen.

* * * * *